(12) United States Patent
Lu

(10) Patent No.: US 7,109,539 B2
(45) Date of Patent: Sep. 19, 2006

(54) MULTIPLE-BIT MAGNETIC RANDOM ACCESS MEMORY CELL EMPLOYING ADIABATIC SWITCHING

(75) Inventor: Yu Lu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/898,800

(22) Filed: Jul. 26, 2004

(65) Prior Publication Data

US 2005/0199927 A1   Sep. 15, 2005

Related U.S. Application Data

(60) Provisional application No. 60/551,398, filed on Mar. 9, 2004.

(51) Int. Cl.
*H01L 29/76* (2006.01)

(52) U.S. Cl. ................. 257/295; 365/48; 365/50; 365/55; 365/158; 365/171; 365/173; 365/180

(58) Field of Classification Search ........... 365/48, 365/50, 55, 158, 171, 173, 180
See application file for complete search history.

(56) References Cited

U.S. PATENT DOCUMENTS 6,545,906 B1 * 4/2003 Savtchenko et al. ........ 365/158

OTHER PUBLICATIONS

U.S. Appl. No. 10/691,300, filed Oct. 22, 2003, Yu Lu.

* cited by examiner

*Primary Examiner*—Mai-Huong Tran
(74) *Attorney, Agent, or Firm*—Wan Yee Cheung; Ryan, Mason & Lewis, LLP

(57) ABSTRACT

A multiple-bit memory cell for use in a magnetic random access memory circuit includes a first adiabatic switching storage element having a first anisotropy axis associated therewith and a second adiabatic switching storage element having a second anisotropy axis associated therewith. The first and second anisotropy axes are oriented at a substantially non-zero angle relative to at least one bit line and at least one word line corresponding to the memory cell. The memory cell is configured such that two quadrants of a write plane not used for writing one of the storage elements can be beneficially utilized to write the other storage element so that there is essentially no loss of write margin in the memory cell.

22 Claims, 6 Drawing Sheets

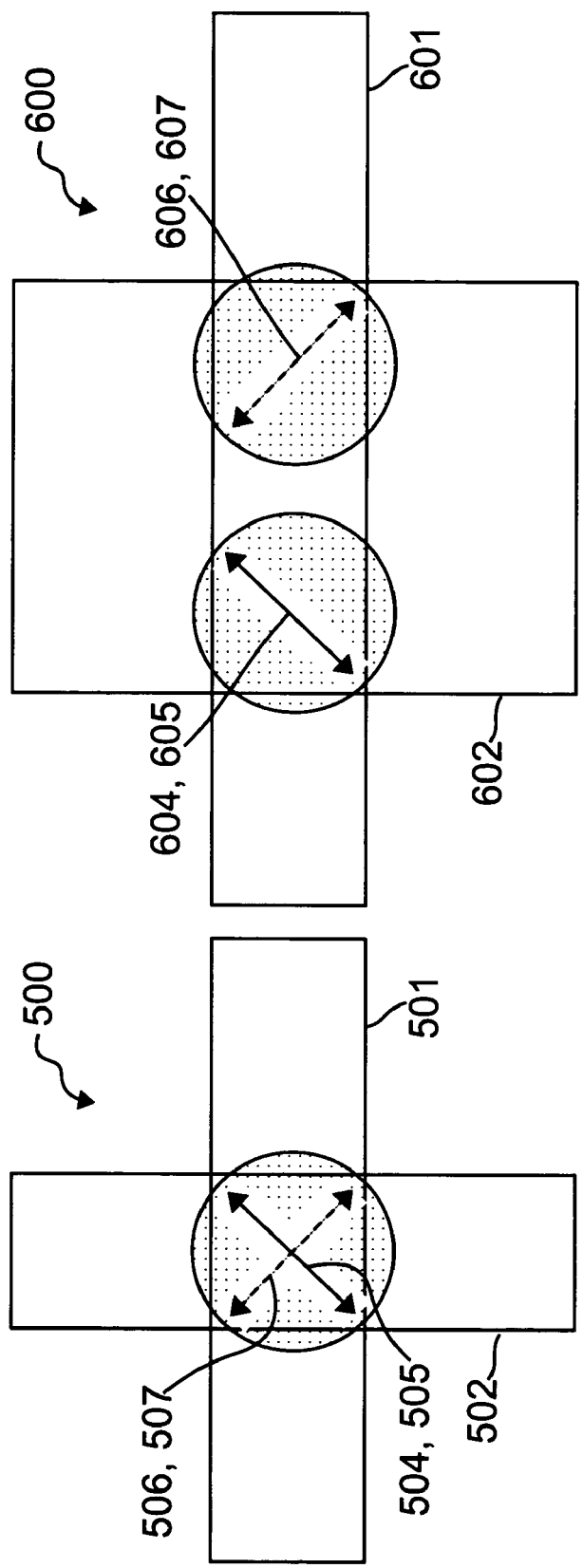

MULTIPLE-BIT MAGNETIC RANDOM ACCESS MEMORY CELL EMPLOYING ADIABATIC SWITCHING

CROSS-REFERENCE TO RELATED APPLICATIONS

This application claims the benefit of U.S. Provisional Application Ser. No. 60/551,398 filed on Mar. 9, 2004, the disclosure of which is incorporated herein by reference.

FIELD OF THE INVENTION

The present invention relates generally to memory devices, and more particularly relates to a multiple-bit magnetic random access memory (MRAM) cell architecture configured for adiabatic switching.

BACKGROUND OF THE INVENTION

An MRAM cell typically includes a magnetic storage element, for example, a magnetic tunnel junction (MTJ) device, for storing a bit of information represented by two stable states in which the memory cell can reside. While semiconductor process technology, such as, for example, complementary metal-oxide-semiconductor (CMOS) technology, used to fabricate MRAM cells continues to scale aggressively below 0.18 micrometer (μm) dimensions, conventional MTJ devices often encounter difficulties due, at least in part, to a super-paramagnetic effect. The super-paramagnetic effect generally arises from fundamental principles of thermal dynamics and is related to the total magnetic moment per bit, the switching field, and the temperature of the MTJ device in storage or operation.

When an energy barrier between the two stable states of a given MRAM cell (often defined as a product of the total magnetic moment and the switching field associated with the device) is not much larger than the thermal energy per single degree of freedom kT, where k is Boltzman's constant and T is temperature in degrees Kelvin, the thermal energy alone could spontaneously switch the state of the memory cell without any external excitation (e.g., magnetic field). This may cause the information stored in the MRAM to randomize over time, thus undesirably affecting the data integrity of the MRAM. The requirement of maintaining an adequately large total magnetic moment for a given MRAM cell in order to avoid spontaneous switching is in direct contradiction with the trend to scale down the size of the MRAM cell and switching field.

In order to increase density in an MRAM array, it is known to use a memory cell architecture that comprises more than one magnetic storage element. For example, co-pending U.S. patent application entitled "Magnetic Random Access Memory Cell," filed on Oct. 22, 2003 and assigned Ser. No. 10/691,300, which is incorporated by reference herein, describes an n-transistor, n-MTJ memory cell providing increased cell density without significantly reducing a lateral size of the MTJ device associated with the memory cell. Conventional multiple-bit memory cell architectures, however, generally exhibit a reduced write margin. This is due, at least in part, to the fact that the region of operation during writing is substantially symmetrical in all four quadrants of a write plane in which the memory cell is written. Consequently, the multiple bits in a given memory cell must share the region of operation with one another.

There exists a need, therefore, for an architecture for implementing a magnetic memory cell which provides increased memory cell density without suffering from one or more of the above-noted deficiencies associated with conventional magnetic memory cells. Moreover, it would be desirable if the improved memory cell architecture was compatible with existing integrated circuit (IC) fabrication process technologies.

SUMMARY OF THE INVENTION

The present invention, in an illustrative embodiment, is an improved magnetic memory cell architecture that combines the benefits of multiple-bit storage capability and adiabatic switching to advantageously provide a magnetic memory cell having increased storage density without significantly reducing a write margin of the memory cell. Moreover, the memory cell architecture of the present invention may be formed using a conventional integrated circuit (IC) fabrication technology, such as, for example, a CMOS process. Consequently, the cost of manufacturing the improved magnetic memory cell is not significantly increased.

In accordance with one aspect of the invention, a multiple-bit memory cell for use in a magnetic random access memory circuit includes a first adiabatic switching storage element having a first anisotropy axis associated therewith and a second adiabatic switching storage element having a second anisotropy axis associated therewith. The first and second anisotropy axes are oriented at a substantially non-zero angle relative to at least one bit line and at least one word line corresponding to the memory cell. The memory cell is configured such that two quadrants of a write plane not used for writing one of the storage elements can be beneficially utilized to write the other storage element so that there is essentially no loss of write margin in the memory cell.

In accordance with another aspect of the invention, an MRAM array including a plurality of memory cells and a plurality of bit lines and word lines for selectively accessing one or more of the memory cells is provided. At least one of the memory cells in the MRAM array includes at least first and second adiabatic switching storage elements, the first and second adiabatic switching storage elements having anisotropy axes associated therewith that oriented in a substantially non-zero angle relative to at least one bit line and/or at least one word line corresponding to the at least one memory cell.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 5 is a top planar view of an exemplary memory cell of the type depicted in FIGS. 2 and 3, in accordance with the present invention.

FIG. 6 is a top planar view of an exemplary memory cell of the type depicted in FIG. 4, in accordance with the present invention.

DETAILED DESCRIPTION OF THE INVENTION

Figure 1B:
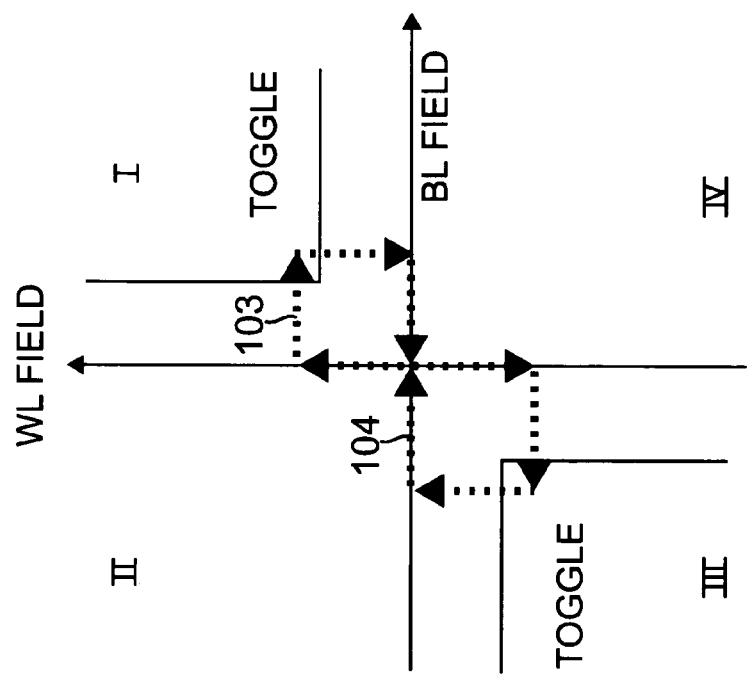
FIGS. 1A and 1B are graphical illustrations depicting exemplary switching thresholds for both a direct write and a toggle write in a field plane for a magnetic memory cell designed for adiabatic switching.

The present invention will be described herein in the context of an illustrative magnetic memory cell which may be used in conjunction with other memory cells to form an MRAM array. It should be appreciated, however, that the invention is not limited to this or any particular memory cell architecture. Rather, the invention is more generally applicable to techniques for advantageously increasing a physical density of the magnetic memory cell without also reducing a write margin of the cell. Moreover, although implementations of the present invention are described herein with reference to metal-oxide-semiconductor (MOS) transistors and MTJ devices, it should be appreciated that the invention is not limited to such devices, and that alternative devices, such as, for example, bipolar junction transistor (BJT) devices and other magnetic storage elements (e.g., giant magneto-resistive (GMR) devices), may be similarly employed, with or without modifications to the inventive memory cell architecture, as will be understood by those skilled in the art.

It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual integrated circuit device.

In accordance with an illustrative embodiment of the invention, an exemplary MRAM cell is provided which is capable of storing two bits of binary information, although the present invention is not limited to this or any particular number of bits of storage. Memory cells capable of storing two or more bits of information may be referred to herein as multiple-bit or multibit memory cells. Each of the bits in a given memory cell may be represented an orientation of the magnetization of a corresponding magnetic storage element, which may comprise, for example, an MTJ device, relative to a reference or fixed magnetization orientation. An important aspect of the invention is that both of the magnetic storage elements in the memory cell are configured for adiabatic switching. Adiabatic switching as the term is used herein refers primarily to a specific arrangement of the magnetic storage elements within the memory cell that allows a transition between logical states associated with the corresponding magnetic storage elements to be done in a substantially continuous fashion.

A magnetic memory cell that is designed for adiabatic switching preferably comprises two adiabatic switching storage elements, each storage element having an anisotropy axis oriented at a non-zero angle relative to either a bit line or a word line corresponding to the memory cell. The two storage elements are preferably arranged such that one storage element is stacked on top of the other for increased memory cell density, with the anisotropy axis of each storage element being aligned substantially perpendicular relative to one another, although the two storage elements are not limited to being aligned perpendicular to one another.

For a given one of the adiabatic switching storage elements, which preferably includes two coupled ferromagnetic layers, if the two ferromagnetic layers have substantially identical magnetic moments in relation to one another, application of a magnetic field traversing a particular path in the field plane would cause the storage element to change its magnetic state. This may be referred to as "toggle writing." If the two ferromagnetic layers have slightly different magnetic moments in relation to each other, the application of a magnetic field traversing another path in the field plane would cause the storage element to be written to a desired logical state. This may be referred to as "direct writing." Toggle writing and direct writing are described in further detail, for example, in U.S. Pat. No. 6,545,906 to Savtchenko et al., which is incorporated by reference herein. The magnetic energy of the storage element is a continuous function of the applied magnetic field for both of these two types of write operations, which is a characteristic of adiabatic switching.

Adiabatic switching, as employed in conjunction with the improved memory cell architecture of the present invention, offers significant advantages over conventional memory cell designs wherein the anisotropy axis of the storage element is oriented essentially along one of the write lines corresponding to the memory cell. Such advantages may include, but are not limited to, increased write margin, reduced thermally activated soft-error-rate (SER), etc.

Figure 1A:
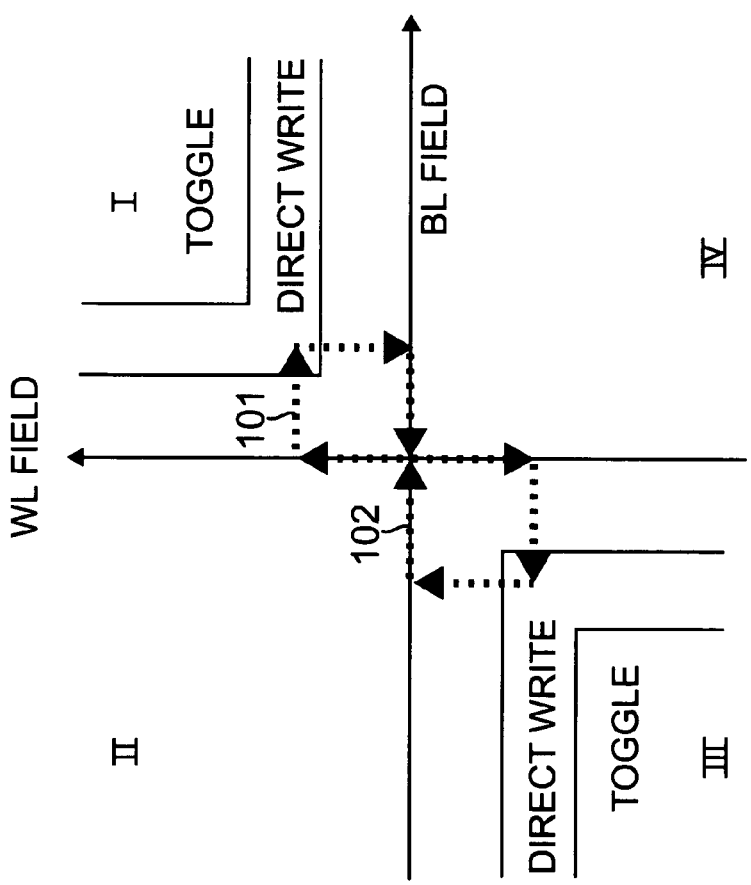

FIGS. 1A and 1B are graphical representations depicting exemplary switching thresholds for both a direct write and a toggle write in a field plane for a magnetic memory cell. As apparent from the figures, only quadrants I and III are used for writing a given one of the magnetic storage elements in the cell. A magnetic field passing in the other two quadrants, namely, quadrants II and IV, has essentially no effect on a magnetic state, and thus the logical state, of the memory cell. This implies that only unidirectional write currents are needed for the operation of a toggle cell memory architecture, while bidirectional write currents are required for direct writing.

An exemplary write operation of a memory cell is illustrated by magnetic field paths 101, 102, 103 and 104. The magnetic field may be generated, at least in part, by electrical currents flowing in close relative proximity to the storage element to be written, which preferably resides at an intersection of a bit line (BL) and a write line (WL) corresponding to the cell. FIG. 1A is an exemplary write threshold diagram of a storage element having a certain degree of imbalance that allows both direct writing and toggle writing modes of operation. FIG. 1B is an exemplary write threshold diagram of a storage element with a substantially balanced configuration that allows only a toggle writing mode of operation.

For current MRAM cell designs, only a magnetic field oriented within the write plane of a given magnetic storage element has any significant effect in writing the state of the cell. In the write plane, only two of the four quadrants are used by each adiabatic switching storage element in the memory cell, as previously stated. The present invention takes advantage of this property of the adiabatic switching storage element to store two bits of information in each memory cell, a first bit of the memory cell utilizing two quadrants (e.g., quadrants II and IV) of the write plane that are not occupied by a second bit (e.g., quadrants I and III).

Figure 2:
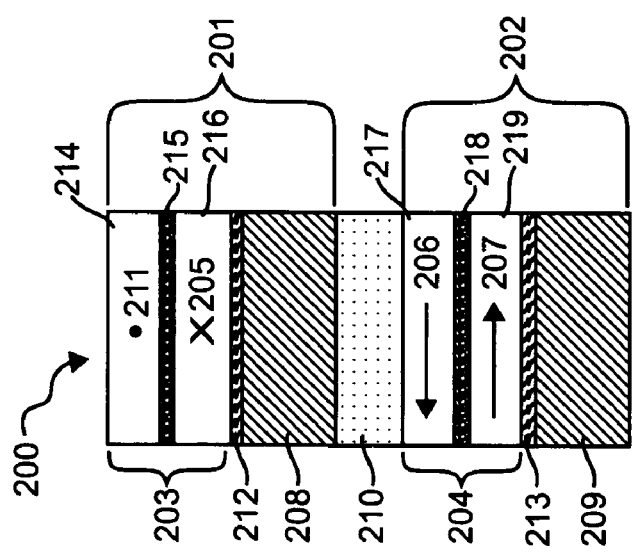
FIG. 2 is a cross-sectional view illustrating an exemplary memory cell including two stacked storage elements, formed in accordance with one embodiment of the present invention.

FIG. 2 is a cross-sectional view depicting at least a portion of an exemplary MRAM cell 200 in which the techniques of the present invention are implemented. The exemplary memory cell 200 comprises two MTJ devices 201 and 202, or alternative magnetic storage devices (e.g., GMR devices), that are stacked substantially vertically in relation to one another. Each of the MTJ devices 201 and 202 includes an adiabatic switching storage element 203 and 204, respectively. In accordance with an illustrative embodiment of the invention, each of the two storage elements 203, 204 has an anisotropy axis associated therewith that is oriented at a non-zero angle relative to either a bit line or a word line (not shown) corresponding to the memory cell 200.

The respective anisotropy axes of the adiabatic switching storage elements 203, 204 are preferably oriented substantially perpendicular in relation to one another. For example, storage element 203 includes two coupled magnetic layers having respective anisotropy axes 211 and 205 substantially perpendicular to a plane of the figure (e.g., out of the page and into the page, respectively). Likewise, storage element 204 preferably includes two coupled magnetic layers with respective anisotropy axes 206 and 207 oriented substantially parallel to the plane of figure and substantially perpendicular to anisotropy axes 211 and 205 of storage element 203.

Adiabatic switching storage element 203 preferably comprises at least top and bottom ferromagnetic layers 214 and 216, respectively, and at least one magnetic coupling layer 215 therebetween separating the top and bottom ferromagnetic layers 214, 216. The top and bottom ferromagnetic layers 214, 216 may comprise any suitable ferromagnetic material, including, but not limited to, iron (Fe), cobalt (Co), nickel (Ni), boron (B), nickel/iron alloys (NiFe), cobalt/iron/boron alloys (CoFeB), and combinations comprising at least one of the foregoing materials. The coupling layer 215 may comprise a nonmagnetic material, including, but not limited to, Ruthenium (Ru). The cross-sectional thickness of each of the top and bottom ferromagnetic layers 214, 216 may be, for example, about 3–10 nanometers (nm) and the cross-sectional thickness of the coupling layer 215 is preferably about 1–2 nm, although the invention is not limited to these specific dimensions. Storage element 204 may also comprise at least top and bottom ferromagnetic layers 217 and 219, respectively, and at least one magnetic coupling layer 218 therebetween separating the top and bottom ferromagnetic layers 217, 219. Storage element 204 may be formed in a manner similar to storage element 203.

Each of the MTJ devices 201, 202 preferably includes at least one reference layer 208 and 209, respectively. A magnetization orientation of the reference layers 208, 209 is substantially fixed so as to provide a frame of reference for determining the logical states of corresponding MTJ devices 201 and 202. MTJ device 201 preferably includes at least one tunneling barrier layer 212 between the reference layer 208 and the corresponding adiabatic switching element 203. Tunneling barrier layer 212 is preferably formed of any suitable nonmagnetic conductor material, as will be known by those skilled in the art. Likewise, MTJ device 202 includes at least one tunneling barrier layer 213 between reference layer 209 and the corresponding adiabatic switching element 204. The two MTJ devices 201, 202 may be separated by a conductive spacer layer 210 therebetween which is preferably nonmagnetic. It is to be appreciated that the reference layer and corresponding storage element may be interchanged in either or both of the MTJ devices 201, 202, as will be described below in conjunction with FIGS. 3A and 3B.

Although not shown, one or more of the reference layers 208, 209 may comprise a plurality of layers. The overall cross-sectional thickness of each of the reference layers 208, 209 is preferably about 30–50 nm, although the invention is not limited to these specific dimensions. The cross-sectional thickness of each of the tunneling barrier layers 212 and 213 is preferably about 1–2 nm and a cross-sectional thickness of the spacer layer 210 is preferably greater than about 10 nm, such as, for example, about 20–30 nm.

Figure 3B:
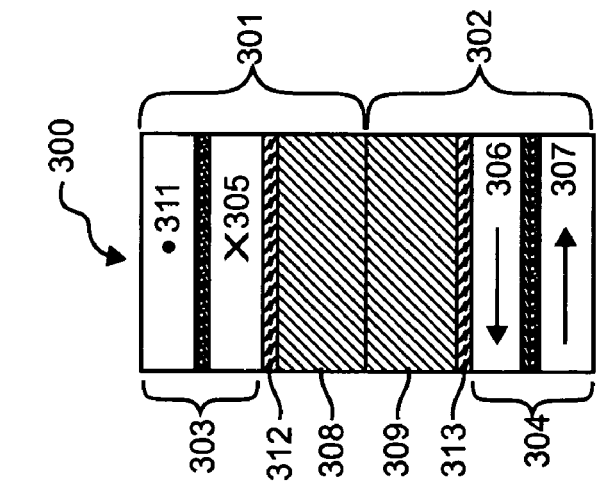
FIGS. 3A and 3B are cross-sectional views, each illustrating an exemplary memory cell including two stacked storage elements, formed in accordance with alternative embodiments of the invention.
Figure 3A:
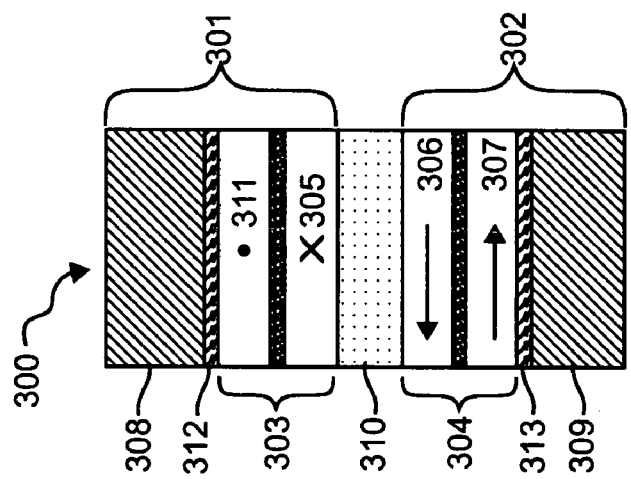

FIG. 3A is a cross-sectional view illustrating an exemplary MRAM cell 300, formed in accordance with an alternative embodiment of the invention. Like the memory cell 200 depicted in FIG. 2, memory cell 300 comprises two MTJ devices 301 and 302, or alternative magnetic storage devices (e.g., GMR devices), stacked substantially vertically with respect to one another. Each of the MTJ devices 301 and 302 includes an adiabatic switching storage element 303 and 304, respectively, having its respective anisotropy axes oriented at a non-zero angle relative to either a bit line or a word line (not shown) corresponding to the memory cell 300. The respective anisotropy axes of the storage elements 303, 304 are preferably also oriented substantially perpendicular relative to one another. For example, storage element 303 includes two coupled magnetic layers with respective anisotropy axes 311 and 305 aligned substantially perpendicular with respect to a plane of the figure (e.g., out of the page and into the page, respectively), while storage element 304 includes two coupled magnetic layers having respective anisotropy axes 306 and 307 oriented substantially parallel to the plane of the figure and substantially perpendicular to anisotropy axes 311 and 305 of storage element 303.

Each of the MTJ devices 301 and 302 preferably includes at least one reference layer 308 and 309, respectively, associated therewith. In comparison to the memory cell 200 shown in FIG. 2, reference layer 308 and the corresponding adiabatic switching storage element 303 in MTJ device 301 are interchanged, such that reference layer 308 is above corresponding storage element 303, while reference layer 309 is below corresponding storage element 304, as in memory cell 200. MTJ device 301 preferably includes a tunneling barrier layer 312 between the reference layer 308 and the corresponding adiabatic switching storage element 303. Similarly, MTJ device 302 preferably includes a tunneling barrier layer 313 between reference layer 309 and corresponding storage element 304. The tunneling barrier layers 312, 313 are preferably formed of any nonmagnetic conductor material. The two MTJ devices 301, 302 are separated by a conductive spacer layer 310 therebetween which is preferably nonmagnetic.

FIG. 3B illustrates another embodiment of exemplary memory cell 300 which is similar to the embodiment depicted in FIG. 3A, except that the memory cell 300 shown in FIG. 3B is configured so that reference layer 309 and the corresponding adiabatic switching storage element 304 in MTJ device 302 are interchanged, and MTJ device 301 is left in the same arrangement as memory cell 200 shown in FIG. 2. In the memory cell embodiment of FIG. 3B, the two reference layers 308 and 309 of MTJ devices 301 and 302, respectively, are formed adjacent to one another. In this arrangement of the memory cell, the spacer layer 310 shown in FIG. 3A may be advantageously eliminated, and at least a portion of the two reference layers 308, 309 may be shared. This may provide a beneficial cost savings compared to other memory cell architectures.

Figure 4:
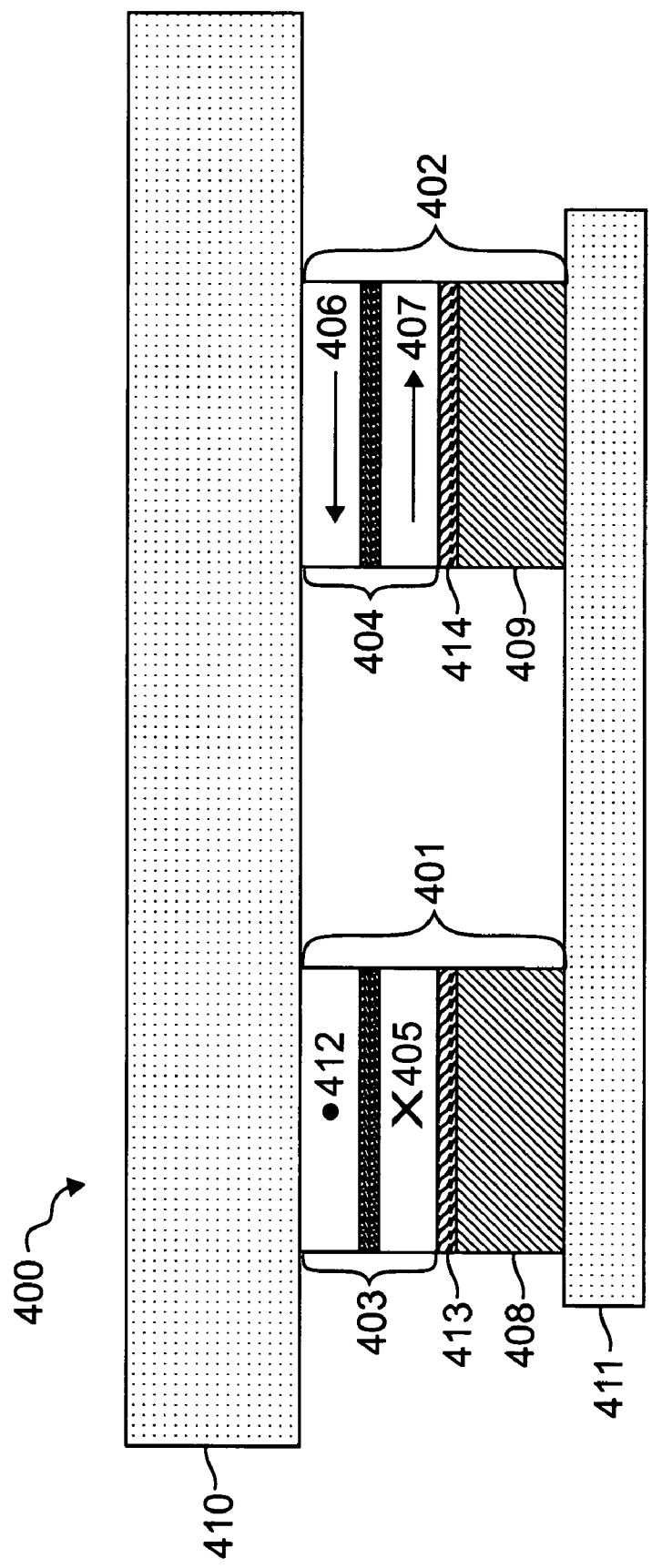
FIG. 4 is a cross-sectional view illustrating an exemplary memory cell including two lateral storage elements, formed in accordance with another embodiment of the invention.

FIG. 4 is a cross-sectional view depicting an exemplary MRAM cell 400, formed in accordance with yet another embodiment of the invention. The exemplary memory cell 400 comprises two MTJ devices 401 and 402, or alternative magnetic storage devices (e.g., GMR devices). However, unlike the MRAM cells 200 and 300 depicted in FIGS. 2 and 3, respectively, wherein the two MTJ devices were stacked vertically on top of one another, the two MTJ devices 401, 402 in MRAM cell 400 are electrically connected together in parallel by a top conductor 410 and a bottom conductor 411. The two MTJ devices 401, 402 are formed substantially on the same horizontal level.

Each of the MTJ devices 401 and 402 includes an adiabatic switching storage element 403 and 404, respectively. In accordance with one aspect of the invention, each of the two storage elements 403, 404 has an anisotropy axis associated therewith that is oriented at a non-zero angle relative to either a bit line or a word line (not shown) corresponding to the memory cell 400. The respective anisotropy axes of the storage elements 403, 404 are also preferably oriented substantially perpendicular relative to one another. For instance, storage element 403 includes two coupled magnetic layers having respective anisotropy axes 412 and 405 substantially perpendicular to the plane of figure (e.g., out of the page and into the page, respectively), while storage element 404 includes two coupled magnetic layers having respective anisotropy axes 406 and 407 substantially parallel to the plane of figure.

Each of the MTJ devices 401 and 402 also preferably includes at least one reference layer 408 and 409, respectively. MTJ device 401 preferably includes a tunneling barrier layer 413 between the reference layer 408 and the corresponding adiabatic switching element 403. Tunneling barrier layer 413 is preferably formed of any nonmagnetic conductor material. Likewise, MTJ device 402 includes a tunneling barrier layer 414 between reference layer 409 and the corresponding adiabatic switching element 404. Although not shown, it is to be appreciated that the order of reference layer 408 and/or reference layer 409 in relation to corresponding storage elements 403 and 404, respectively, in forming MTJ devices 401 and 402 may be reversed, such that at least one of reference layers 408, 409 is formed above the corresponding storage elements 403, 404.

As apparent from the figure, the two MTJ devices 401, 402 are not stacked vertically on top of one another but are formed laterally apart from one another between top and bottom conductors 410 and 411, respectively, and are therefore physically isolated from one another. Consequently, the conductive spacer layer (e.g., 210, 310) present in the stacked memory cell configuration (e.g., memory cells 200 and 300 shown in FIGS. 2 and 3, respectively) is not required and may be eliminated. Although memory cell 400 may not be quite as dense a structure compared to memory cells 200, 300 depicted in FIGS. 2 and 3, the integrated circuit fabrication process used to form memory cell 400 is simpler compared to the process used to form memory cells 200 and 300, and thus may provide certain benefits.

It should be understood that the memory cells 200, 300 and 400 depicted in FIGS. 2, 3 and 4, respectively, are merely illustrative, and that the techniques of the present invention described herein are not limited to only the memory cell structures shown.

Referring now to FIG. 5, there is shown a top planar view illustrating an exemplary MRAM cell 500 including vertically stacked MTJ devices, two embodiments of which are described above in connection with FIGS. 2 and 3. It is to be appreciated that certain layers of the cell (e.g., reference layers, etc.) have been omitted in the figure for ease of explanation. This does not imply that those layers not explicitly shown are omitted in the actual integrated circuit device. The memory cell 500 preferably includes a first conductor 501, which may be referred to herein as a write word line (WWL), and at least a second conductor 502, which may be referred to herein as a write bit line (WBL). The conductors are preferably formed of a metal (e.g., aluminum, copper, etc.) or an alternative electrically conductive material. The WBL 502 is preferably arranged substantially perpendicular to the WWL 501, although other arrangements of WWL 501 and WBL 502 are contemplated.

Anisotropy axes 504 and 505 associated with a first adiabatic switching storage element in memory cell 500 are preferably oriented at about 45 degrees from either the WWL 501 or the WBL 502. Likewise, anisotropy axes 506 and 507 associated with a second adiabatic switching storage element in memory cell 500 are preferably oriented at about 45 degrees from either the WWL 501 or the WBL 502 and, furthermore, are preferably oriented perpendicular to the anisotropy axes 504, 505 of the first storage element.

FIG. 6 is a top planar view illustrating an exemplary MRAM cell 600 including parallel-connected MTJ devices, an embodiment of which is described above in connection with FIG. 4. Like the exemplary memory cell 500 shown in FIG. 5, certain layers of the cell (e.g., reference layers, etc.) have been removed for ease of explanation. The memory cell 600 preferably includes a first conductor 601, which may be a WWL, and at least a second conductor 602, which may be a WBL. The WBL 602 is preferably arranged substantially perpendicular to the WWL 601, although alternative arrangements of WWL 601 and WBL 602 are contemplated.

Anisotropy axes 604 and 605 associated with a first adiabatic switching storage element in the memory cell 600 are preferably oriented at about 45 degrees from either the WWL 601 or the WBL 602. Likewise, anisotropy axes 606 and 607 associated with a second adiabatic switching storage element in the memory cell 600 are also preferably oriented at about 45 degrees from either the WWL 601 or the WBL 602 and, moreover, are preferably oriented perpendicular to the anisotropy axes 604, 605 of the first storage element. Note, that in memory cell 600, the placement of the two MTJ devices with respect to the WWL 601 and WBL 602 does not significantly affect the write operation and is thus not limited to the precise configuration shown.

Figure 7:
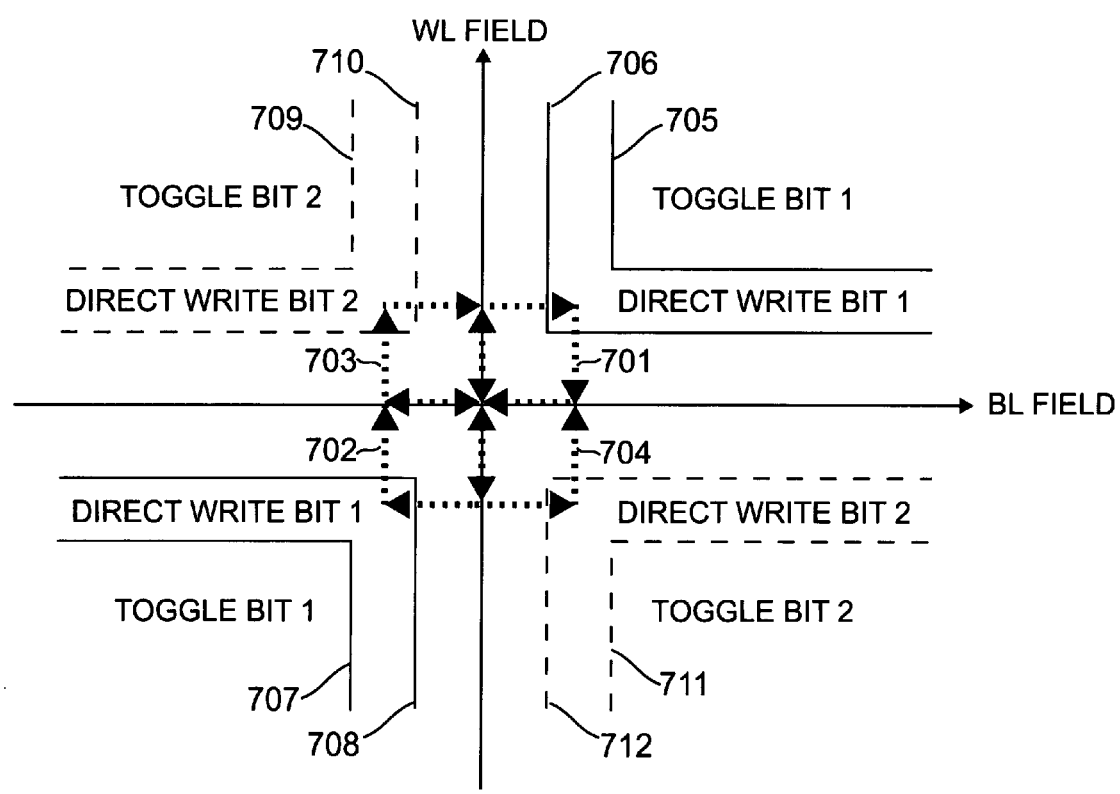
FIG. 7 is a graphical illustration depicting exemplary magnetic field paths which can be used in a direct write operation of a memory cell, in accordance with the present invention.

FIG. 7 illustrates exemplary magnetic field paths which may be used in a direct write operation of a memory cell formed in accordance with an embodiment of the invention. As apparent from the figure, magnetic field paths 701 and 702 may be used to write a first adiabatic switching storage element (storage element 1) in the memory cell to logical "0" and "1" states. Likewise, magnetic field paths 703 and 704 may be used to write a second adiabatic switching storage element (element 2) in the memory cell to logical "0" and "1" states. Boundaries 705 and 707 depict illustrative switching thresholds for a toggle write operation of storage element 1, while boundaries 709 and 711 depict illustrative switching thresholds for a toggle write operation of storage element 2. Likewise, boundaries 706 and 708 depict illustrative switching thresholds for a direct write operation of storage element 1, and boundaries 710 and 712 depict illustrative switching thresholds for a direct write operation of storage element 2. Thus, in accordance with the techniques of the present invention, all four quadrants of a write field plane for writing the memory cell are utilized, substantially without conflicting with one another. This implies that bidirectional programming currents are required on both the corresponding WBLs and WWLs associated with the memory cell. This is also the case even when only one bit of the memory cell is used in the direct write mode of operation.

Figure 8:
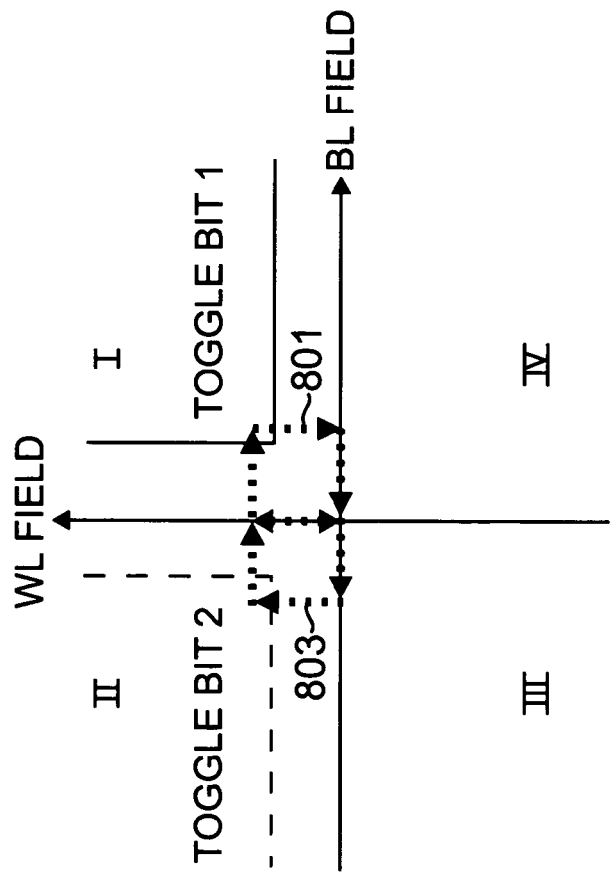
FIG. 8 is a graphical illustration depicting exemplary magnetic field paths which can be used in a toggle write operation of a memory cell, in accordance with one aspect of the present invention.

FIG. 8 illustrates exemplary magnetic field paths which may be used in a toggle write operation of a memory cell formed in accordance with an embodiment of the present invention. As shown in the figure, magnetic field path 801 may be used to write a first adiabatic switching storage element (element 1) in the memory cell to logical "0" and "1" states, while magnetic field path 803 can be used to write a second adiabatic switching storage element (element 2) in the memory cell to logical "0" and "1" states. Only two quadrants, namely, quadrants I and II, of the write field plane are employed, which implies that only one bidirectional programming current is required on either the corresponding WBL or the corresponding WWL associated with the memory cell. In the illustrative embodiment shown in FIG. 8, only one bidirectional WBL programming current is required, the direction of the WBL programming current selecting which of the two storage elements will be toggled.

Figure 9:
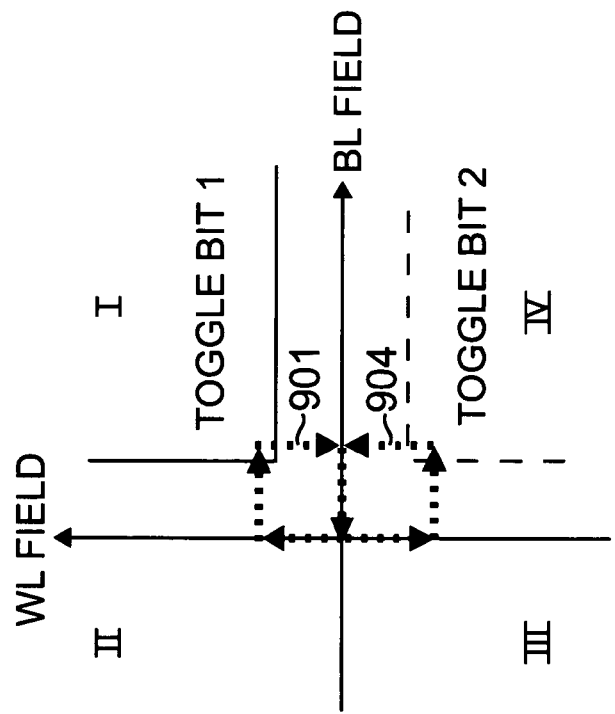
FIG. 9 is a graphical illustration depicting exemplary magnetic field paths which can be used in connection with a toggle write operation of a memory cell, in accordance with another aspect of the present invention.

FIG. 9 depicts exemplary magnetic field paths which can be used in connection with a toggle write operation of a memory cell formed in accordance with another embodiment of the invention. Magnetic field path 901 preferably writes a first adiabatic switching storage element (element 1) in the memory cell to logical "0" and "1" states, while magnetic field path 904 preferably writes a second adiabatic switching storage element (element 2) in the memory cell to logical "0" and "1" states. Only two quadrants, namely, quadrants I and IV, of the write field plane are used, which implies that only one bidirectional programming current is required on either the WBL or WWL corresponding to the memory cell. The use of the WWL or the WBL to carry the programming current in this embodiment selects which of the two storage elements will be toggled, with the WWL being used to toggle the logical state of storage element 1 and the WBL being used to toggle the logical state of storage element 2.

A plurality of multiple-bit memory cell of the present invention may be employed in a MRAM array, including a plurality of bit lines and word lines for accessing the memory cells. At least a portion of the multiple-bit memory cell architecture of the present invention may be implemented in an integrated circuit. A plurality of identical die are typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A multiple-bit memory cell for use in a magnetic random access memory (MRAM) circuit, the MRAM circuit including at least one bit line and at least one word line corresponding to the memory cell, the memory cell comprising:
   a first adiabatic switching storage element having a first anisotropy axis associated therewith; and
   a second adiabatic switching storage element having a second anisotropy axis associated therewith, the first and second anisotropy axes being oriented at a substantially non-zero angle relative to the at least one bit line and the at least one word line corresponding to the memory cell.

2. The memory cell of claim 1, wherein the first and second adiabatic switching storage elements are stacked substantially vertically in relation to one another.

3. The memory cell of claim 1, wherein the first and second adiabatic switching storage elements are spaced apart in relation to one another.

4. The memory cell of claim 1, wherein the first and second anisotropy axes are oriented substantially perpendicular to one another.

5. The memory cell of claim 1, wherein the first anisotropy axis is oriented at a first angle relative to the at least one bit line and the at least one word line corresponding to the memory cell and the second anisotropy axis is oriented at a second angle relative to the at least one bit line and the at least one word line corresponding to the memory cell.

6. The memory cell of claim 5, wherein the first angle is less than about 90 degrees and the second angle is in a range from about 90 degrees to about 180 degrees.

7. The memory cell of claim 1, wherein the first and second anisotropy axes are substantially nonaligned relative to one another.

8. The memory cell of claim 1, further comprising first and second magnetic tunnel junction devices, wherein the first magnetic tunnel junction device comprises the first adiabatic switching storage element and the second magnetic tunnel junction device comprises the second adiabatic switching storage element.

9. The memory cell of claim 8, wherein at least one of the first and second magnetic tunnel junction devices comprises at least one reference layer proximate to the respective first and second adiabatic switching storage elements, the at least one reference layer being separated from a corresponding adiabatic switching storage element by at least one nonmagnetic barrier layer.

10. The memory cell of claim 8, wherein the first and second magnetic tunnel junction devices are separated from one another by at least one spacer layer.

11. The memory cell of claim 10, wherein the at least one spacer layer comprises a nonmagnetic conductor.

12. The memory cell of claim 1, wherein at least one of the first and second adiabatic switching storage elements comprises:
   a first ferromagnetic layer; and
   at least a second ferromagnetic layer, the second ferromagnetic layer being separated from the first ferromagnetic layer by at least one magnetic coupling layer.

13. The memory cell of claim 12, wherein at least one of the first and second ferromagnetic layers comprises a metal.

14. The memory cell of claim 12, wherein at least one of the first and second ferromagnetic layers comprises at least one of iron, cobalt, nickel and boron.

15. The memory cell of claim 12, wherein the at least one magnetic coupling layer comprises ruthenium.

16. The memory cell of claim 1, wherein the memory cell is configured such that two quadrants of a write plane not used for writing one of the adiabatic switching storage elements are utilized to write another of the adiabatic switching storage elements, whereby a write margin of the memory cell is increased.

17. A magnetic random access memory (MRAM) array including a plurality of multiple-bit memory cells and a plurality of bit lines and word lines for selectively accessing one or more of the memory cells, at least one of the memory cells comprising:
   a first adiabatic switching storage element having a first anisotropy axis associated therewith; and
   a second adiabatic switching storage element having a second anisotropy axis associated therewith, the first and second anisotropy axes being oriented at a substantially non-zero angle relative to at least one of the bit lines and at least one of the word lines corresponding to the at least one memory cell.

18. The MRAM array of claim 17, wherein the first and second adiabatic switching storage elements in the at least one memory cell are stacked substantially vertically in relation to one another.

19. The MRAM array of claim 17, wherein the first and second adiabatic switching storage elements in the at least one memory cell are spaced apart in relation to one another.

20. The MRAM array of claim 17, wherein the first and second anisotropy axes are oriented substantially perpendicular to one another.

21. The MRAM array of claim 17, wherein the first anisotropy axis is oriented at a first angle relative to the at least one bit line and the at least one word line corresponding to the at least one memory cell, and the second anisotropy axis is oriented at a second angle relative to the at least one bit line and the at least one word line corresponding to the at least one memory cell.

22. An integrated circuit including at least one multiple-bit memory cell, the at least one memory cell comprising:
   a first adiabatic switching storage element having a first anisotropy axis associated therewith; and
   a second adiabatic switching storage element having a second anisotropy axis associated therewith, the first and second anisotropy axes being oriented at a substantially non-zero angle relative to at least one bit line and at least one word line corresponding to the at least one memory cell.

* * * * *